United States Patent [19]

Iwanczyk

[11] Patent Number: 5,057,892
[45] Date of Patent: Oct. 15, 1991

[54] LIGHT RESPONSIVE AVALANCHE DIODE

[75] Inventor: Jan S. Iwanczyk, Los Angeles, Calif.

[73] Assignee: Xsirius Photonics, Inc., Los Angeles, Calif.

[21] Appl. No.: 583,021

[22] Filed: Sep. 14, 1990

[51] Int. Cl.⁵ .................... H01L 29/90; H01L 27/14; H01L 29/44
[52] U.S. Cl. ........................ 357/30; 357/13; 357/56; 357/68; 357/72
[58] Field of Search ............. 357/13, 30, 56, 68, 357/72

[56] References Cited

U.S. PATENT DOCUMENTS 3,886,579  5/1975  Ohuchi et al. ............... 357/30
4,463,368  7/1984  McIntyre et al. ............. 357/30

OTHER PUBLICATIONS

Gelezunas et al., *Appl. Phys. Lett.*, vol. 30, No. 2, Jan. 15, 1977, pp. 118–120, "Uniform . . . Silicon".
Trommer et al., Siemans Forsch-u. Entwickl.-Ber. Bd. 11 (1982), Nr. 4, Springer Verlag, 1982, "InGaAs/InP . . . Range", pp. 216–220.
Zirngibl et al., *Appl. Phys. Lett.*, vol. 54 (No. 21), May 22, 1989, pp. 2076–2078, "Characterization . . . Contact".
Licari, *Plastic Coatings for Elect.*, McGraw Hill, 1970, New York, pp. 30, 33, 34, 99.

*Primary Examiner*—Jerome Jackson, Jr.
*Attorney, Agent, or Firm*—Herbert M. Shapiro

[57] ABSTRACT

Large area semiconductor photodiodes are made free of microcracks by forming on the incident light surface of the device a ring-shaped electrode structure. The electrode structure adds rigidity to the device when the edge surface of the device is later bevelled, a process which creates microcracks normally.

7 Claims, 2 Drawing Sheets

LIGHT RESPONSIVE AVALANCHE DIODE

FIELD OF THE INVENTION

This invention relates to avalanche photodiodes and more particularly to light responsive avalanche photodiodes having large surface areas.

BACKGROUND OF THE INVENTION

Large area, light responsive, avalanche photodiodes are described in the IEEE Transactions on Nuclear Science, VOL NS-30, 1 February 1983 on page 431 et seq. in an article entitled "Scintallation detectors using large area Silicon Avalanche Photodiodes" by G. Huth et al and in the IEEE Transactions on Nuclear Science, VOL NS-32, NO. 1, February 1985 on page 563 et seg. in an article entitled "Recent Advances In Large Area Avalanche Photodiodes" by M. R. Squillante et al.

Those articles describe a large area (one inch diameter) avalanche photodiode for use with scintallation crystals. The photodiodes described overcome the area, sensitivity, and gain limitations of prior art photodiodes by employing a surface inversion layer to improve sensitivity, using improved growth and doping techniques to achieve a large uniform area, and using transmutated, doped silicon to reduce local voltage breakdown as described in those publications. The publications also describe bevelled edge surfaces of from five to fifteen degrees, to avoid premature breakdown at high voltage due to surface currents, as well as antireflection coatings for light detection enhancement.

The photodiodes described in those publications are formed by the diffusion of P-type material into a bulk N-type silicon wafer. The diffusion creates a graded concentration of dopants beginning at the wafer surface and extending inwardly. A graded dopant concentration produces a net drift of carriers towards a broad area PN junction formed in a plane parallel to the wafer surface. The drift region extends to the edge of the space charge region associated with the PN junction.

Under conditions of a reverse bias (1500 volts) across the PN junction, a very high electric field is produced creating an avalanche region extending from the drift region through the avalanche (space charge) region of the PN junction. Minority carriers (electrons) drift towards the avalanche region and enter the space charge region where they quickly attain velocities to cause collisions with bound electrons in the lattice of the wafer crystal. The collisions free new electrons which in turn undergo new collisions resulting in a net gain in the electrical signal.

The active thickness of the device is the drift region of about 200 micrometers with full gain being realized only by carriers generated in the first 10 to 60 micrometers. Because of the small active region and the known low stopping power of silicon, the photodiodes are largely insensitive to X-rays or Gamma rays of energies greater than 20 kev.

BRIEF DESCRIPTION OF ILLUSTRATIVE EMBODIMENTS OF THIS INVENTION

In accordance with the principles of this invention, a semiconductor avalanche photodiode includes a PN junction very close to the incident light surface of the device such that the depletion region associated with the junction approaches the surface and the drift region is minimized or eliminated entirely.

Incident light, thus, generates electron-hole carriers in the depletion region of the PN junction under reverse bias conditions. The sensitivity of photodiodes with PN junctions close to the surface is high and such devices are suitable for applications in which few photons impinge the device surface.

But the proximity of the junction to the device surface renders the device vulnerable to microcracks which are known to be present in these types of devices. In accordance with one aspect of this invention, microcracks are eliminated by mounting the semiconductor wafer on a support ring and bevelling the edge surface of the semiconductor wafer and the support ring at the same time. Particularly if the support ring comprises Silicon or a reactive metal, thus matching the thermal characteristics of the wafer, will the resulting device be free of microcracks.

In accordance with another aspect of this invention, the surface of the wafer comprises a Boron diffusion operative as a minority carrier reflector and or an oxide (or dioxide) coating which improves minority carrier lifetime. The device is operated at the extreme reverse bias range just short of breakdown, breakdown being triggered by incident photons.

DETAILED DESCRIPTION OF AN ILLUSTRATIVE EMBODIMENT OF THIS INVENTION

Figure 1:
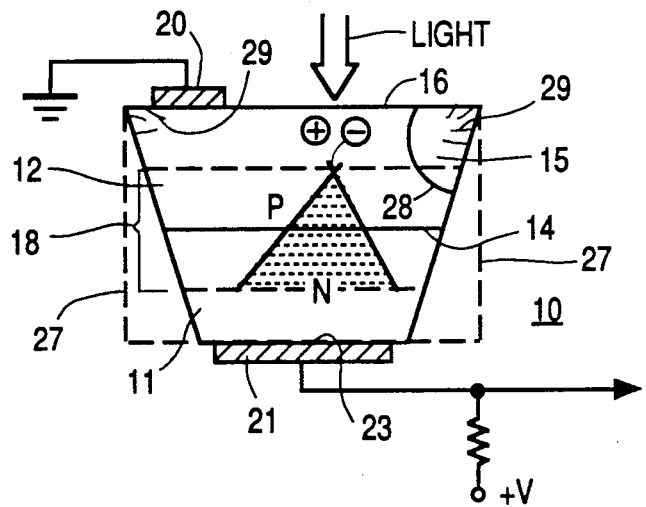
FIG. 1 is a schematic representation of a prior art avalanche photodiode.

FIG. 1 shows a semiconductor photodiode 10. the bulk material of the diode is of N-type conductivity as indicated at 11. A region 12 is converted to P-type conductivity forming PN junction 14. A drift region 15 remains between the upper surface 16 and the depletion region 18 associated with the PN junction.

Electrical contact to the photodiode is by means of electrode 20 formed on surface 16 and an electrode 21 formed on the lower surface 23 as viewed. Electrode 20 is connected to ground.

Typical photodiodes are in the shape of flat discs. Thus, surfaces 16 and 23 are large compared to the edge of the device as will become clear. The edge surface of the device is bevelled as, shown, to reduce surface fields which cause premature breakdown. Thus, surface 16 is larger than surface 23. The device is positioned during use so that light is incident to surface 16 and electrode 20 is shaped to expose as much of surface 16 as possible. The bevel is such as to remove as much material from the original edge of the device as indicated by broken line 27. The bevel produces an edge surface at an angle 28 which is typically about fifteen degrees.

Prior art photodiodes always contain some microcracks represented at 29. Microcracks have been recognized to exist but have been ignored because they did not appear to impair device performance. It has been found that for photodiodes with high sensitivity and response to UV and blue light the PN junction characteristic of the device, has to be very close to the surface of the device impinged by incoming light and microcracks do impair the operation of such devices. Further, bevelled photodiodes are characterized by increased numbers of microcracks and chips at the feather edge of the diode. If the chipping or micro cracks reach the vicinity of the junction, premature break down occurs.

Figure 2:
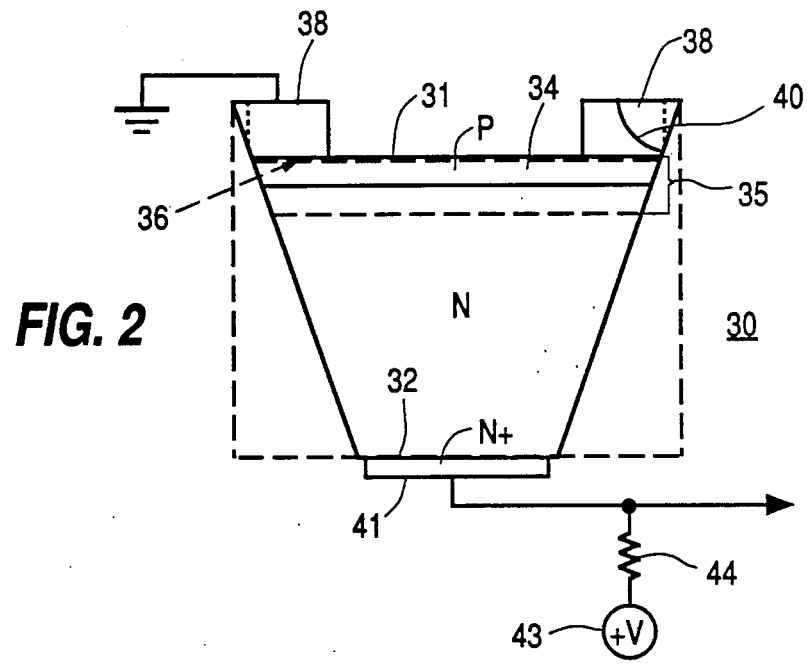
FIG. 2 is a schematic representation of an avalanche photodiode in accordance with the principles of this invention.

FIG. 2 shows a schematic representation of a photodiode 30 in accordance with the principles of this invention. The device includes upper and lower surfaces 31 and 32. The bulk material of the device is N type Silicon and a surface region 34 is converted to P-type conductivity by Gallium diffusion forming depletion region 35. The depletion region extends virtually to the surface 31 as indicated by broken line 36. Integral with the photodiode, prior to bevelling, is an electrode structure 38. The electrode structure preferably comprises Silicon to match the bulk properties of the bulk material of the device and may actually be formed out of the bulk material itself. But the electrode structure may comprise a reactive metal, such as Molybdenum, Tungsten, and Titanium, which match the thermal characteristics of the bulk material. In any case, the electrode structure is in the shape of a ring to expose as large an area of surface 31 to light as possible.

Electrode structure 38 is secured to photodiode surface 31 prior to bevelling to provide the support necessary during the bevelling process to eliminate microcracks and the electrode structure is bevelled simultaneously to form an angle 40. Electrode structure 38 is connected to ground as shown.

A contact region 41 is formed on surface 32. The region is formed by an N type diffusion typically of phosphorus. Region 41 is connected to output circuitry (not shown) and to a source of voltage 43 via resistor 44.

The surface 31 of an avalanche photodiode in accordance with the principle of this invention is passivated with a unique passivation technique. Usual passivation techniques used for passivating silicon power devices were found to cause increased leakage current and induced electronic (high frequency) noise. Such problems are not important for power devices, but are important for avalanche photodiodes.

In accordance with another aspect of this invention, passivation is achieved by a mixture of polyamides. Specifically, two different mixes of silicone polyamides available from Waterford Corporation, New York (SPI-150). The polyamide is in a diglycene xylenene carrier and is generally used for photo-lithographic process. The polyamide is mixed with a like product (SPI-129) which differs from the first product only in viscosity.

The mixture is applied by brushing or by a hypodermic type of applicator, and the purpose is to achieve a thin uniform coating. The resulting film is cured in steps under a pressure of 25 PSI to avoid bubbles during curing. The curing cycle comprised: 40° C. overnight, heat to 100° C. for 1-2 hours, heat to 150° C. for 1-2 hours: heat at between 150° C. and about 250° C. for about three days. The curing cycle was designed to eliminate the solvent in the mix without causing bubbles. Accordingly, although the curing procedure takes place in steps, the temperature durations and numbers of those steps can be varied.

It has been found that other polyamide films hitherto used only for photolithography can be used for passivation in a similar manner.

Figure 3:
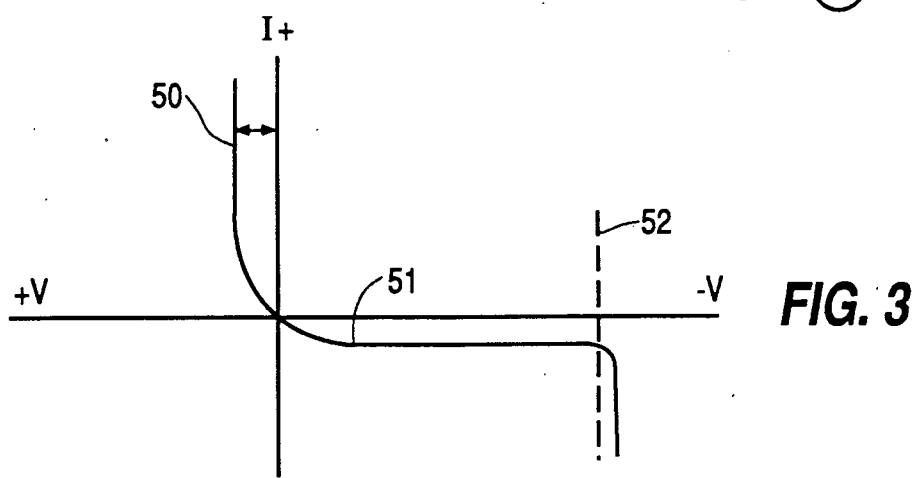
FIG. 3 is a plot of the operating characteristics of the photodiode of FIG. 2.

FIG. 3 shows the operating characteristics of the device of FIG. 2. The curve shown is the usual plot of current versus voltage. The forward bias portion of the curve (50) indicates significant current flow at relatively low voltage levels. But, importantly, under reverse bias conditions, very little current flow occurs even under very high reverse bias conditions as indicated by portion 51 of the curve. Breakdown occurs as indicated by broken vertical line 52 at voltages of about minus 2000 volts, a level not achievable if microcracks were present. The higher the reverse bias without breakdown occuring, the greater the amplification.

Gains of over 1000 have been achieved with avalanched photodiodes having integral electrode conductor structures bevelled simultaneously with the edge surface of the device. In the presence of microcracks, significant "dark" currents are observed which reduces gain and breakdown voltage characteristics.

An avalanche photodiode in accordance with the principles of this invention was made in the following manner: The starting material was to N-type Silicon including Neutron Transmutated Phosphorus doping through the entire wafer. The resistivity of the wafer was about sixty ohm centimeters. Gallium was difussed into the entire surface of the wafer to a depth of about 100 microns to form a P type surface region. All surfaces, including the surface to be exposed to light, were lapped to a depth of sixty five microns followed by polishing and etching to remove damage. Then all surfaces, except that surface which is to be exposed to light, are lapped off down N-type material. The original starting wafer was just under one inch in diameter and twenty mils thick. The surface region was exposed to boron diffusion and an anti-reflective coating was applied. An electrode ring structure twenty mils thick was bonded for example, by conventional aluminum-silicon alloy to the surface to be exposed to light.

In production, a relatively large wafer of silicon (3" in diameter) is provided with a pattern of holes five eight inch in diameter. The silicon discs (1" in diameter) are positioned over the holes and bonded to the plane by an Aluminum-Silicon Alloy, by conductive epoxy, or by a non-alloying diffusion pressure bond. Good mechanical and electrical bonds have been made with all of these techniques. The now mounted wafers (or discs) were cut from the Silicon plane by sand blasting techniques and mounted for bevelling. The discs were mounted at an angle and rotated against a lapping plate. Alternatively, the wafers were spun while subjected to an abrasive slurry of Garnet powder or Aluminum Oxide. In pratice, the entire ring structure need not be bevelled. The ring is necessary for support to prevent microcracks and may be bevelled to an extent indicated by broken lines 59 in FIG. 2. No microcracks were detected on testing.

Figure 4:
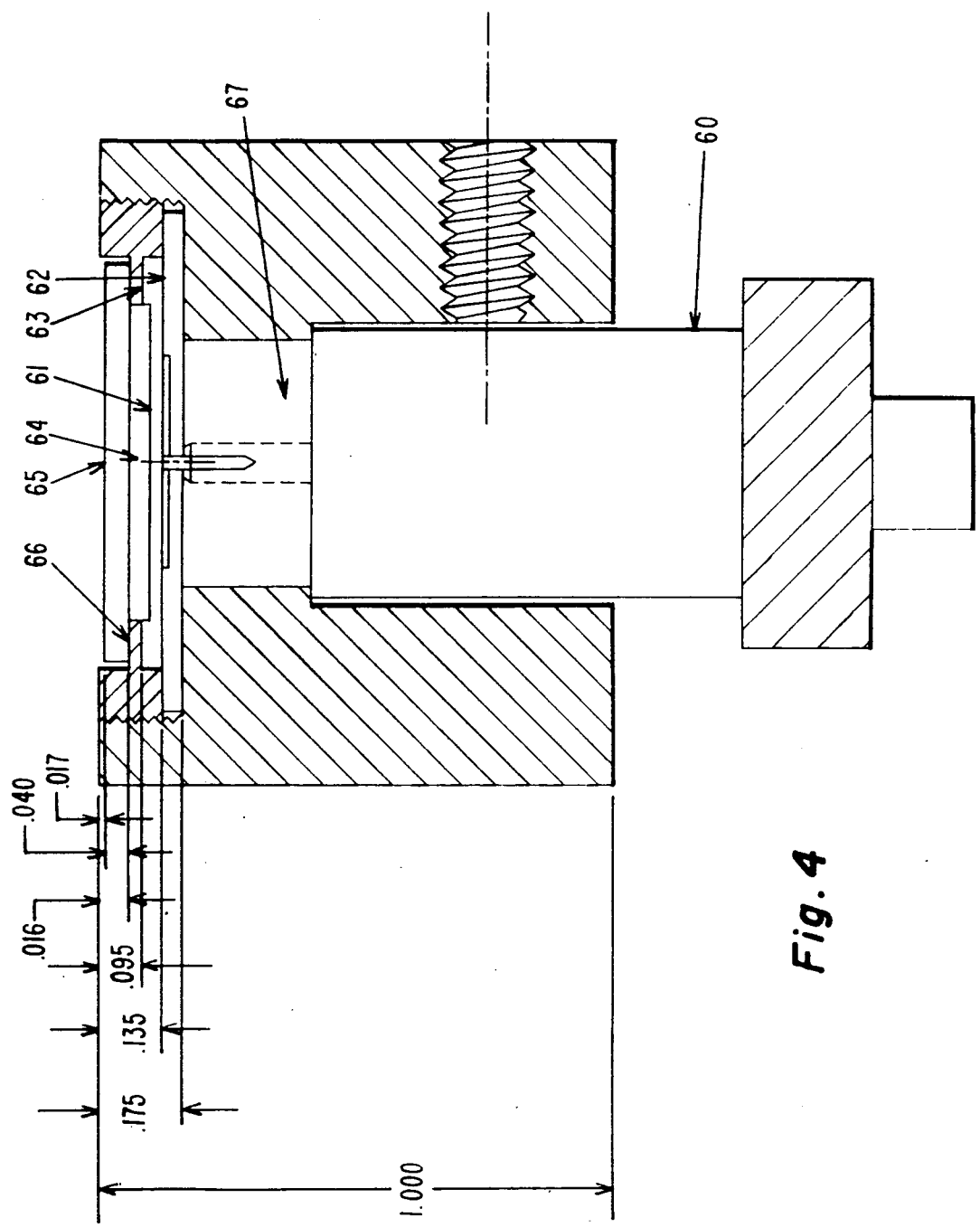
FIG. 4 is a schematic representation of a pratical photodiode assembly.

FIG. 4 is a schematic representation of an avalanche photodiode assembly mounted on a connecter housing 60. The photodiode (61) is mounted on a ceramic substrate 62 and secured in place by a conductive epoxy at 63. The photodiode is covered by an optical coupling (64) and a window (65) is secured in place by an optical epoxy. The photodiode is mounted on insulator 67. The dimensions of the various components of the device are shown in the figure.

Photodiodes made in accordance with the principles of this invention were found to be responsive to radiation over a wide range of wave lengths from 300 nanometers (UV) on the low end to 1000 nanometers (near infra red) at the high end. The devices were sensitive to X rays and Gamma rays of less than 20 KEV and sensative to electrons, alpha particles and other charged particles.

What is claimed is:

1. A semiconductor avalanche photodiode including a first large area surface and an edge surface, said photodiode including a rectifying PN junction in a plane parallel to said first surface, means for impressing a voltage across said PN junction to generate a space charge region, said photodiode also including a ring structure integral with said first surface and defining an aperture for incident light wherein said edge surface and at least a portion of the edge of said ring structure form an angle with said first surface, said angle being between about five and fifteen degrees.

2. A photodiode as set forth in claim 1 also including a region of Boron diffusion at said first surface and co-extensive therewith.

3. A photodiode as set forth in claim 2 also including an oxide coating on said first surface at said aperture.

4. A photodiode as set forth in claim 1 wherein said PN junction is located close to said first surface and said space charge region extends virtually to said first surface.

5. A photodiode as set forth in claim 1 also having a second surface parallel to said first surface and spaced apart thereform, said photodiode comprising N-type conductivity semiconductor material including neutron transmutation doping of phosphorous therethrough and having Gallium diffusion from said first surface for forming said PN junction, said photodiode having a Phosphorus diffusion from said second surface for forming an N± type conductivity region adjacent said second surface.

6. A photodiode as set forth in claim 1, also having a second surface parallel to and spaced apart from said first surface, said second surface including an electrical contact thereto, and means connected between said ring and said contact for impressing a voltage across said PN junction.

7. A photodiode as set forth in claim 4 wherein said PN junction intersects said edge surface, said edge surface having thereon a passivating film comprising a cured polyamide layer.

* * * * *